(12) United States Patent
Tsuboi

(10) Patent No.: US 10,063,801 B2
(45) Date of Patent: Aug. 28, 2018

(54) IMAGE CAPTURING DEVICE

(71) Applicant: CANON KABUSHIKI KAISHA, Tokyo (JP)

(72) Inventor: Hiromasa Tsuboi, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/426,896

(22) Filed: Feb. 7, 2017

(65) Prior Publication Data

US 2017/0230600 A1 Aug. 10, 2017

(30) Foreign Application Priority Data

Feb. 9, 2016 (JP) .................................. 2016-023059

(51) Int. Cl.
*H04N 3/14* (2006.01)
*H04N 5/335* (2011.01)
*H04N 5/3745* (2011.01)
*H01L 27/146* (2006.01)
*H04N 5/355* (2011.01)
*H04N 5/374* (2011.01)
*H04N 5/378* (2011.01)

(52) U.S. Cl.
CPC ..... *H04N 5/3745* (2013.01); *H01L 27/14605* (2013.01); *H01L 27/14612* (2013.01); *H01L 27/14627* (2013.01); *H01L 27/14643* (2013.01); *H04N 5/3559* (2013.01); *H04N 5/3741* (2013.01); *H04N 5/37457* (2013.01); *H04N 5/378* (2013.01)

(58) Field of Classification Search
CPC .. H04N 5/3559; H04N 5/3741; H04N 5/3745; H04N 5/37452; H04N 5/37455; H04N 5/3742; H04N 5/378; H04N 5/37457; H01L 27/14609; H01L 27/14641
See application file for complete search history.

(56) References Cited

U.S. PATENT DOCUMENTS

| 5,933,190 A | * | 8/1999 | Dierickx | ........... H01L 27/14643 257/E27.133 |
| 2002/0031017 A1 | * | 3/2002 | Yumoto | ................. G11C 29/24 365/200 |

(Continued)

FOREIGN PATENT DOCUMENTS

JP 2000165754 A 6/2000

*Primary Examiner* — Chia-Wei A Chen
(74) *Attorney, Agent, or Firm* — Canon U.S.A., Inc. IP Division

(57) ABSTRACT

An image capturing device includes a pixel unit and a buffer. In the pixel unit, pixels are arranged in a matrix, wherein each pixel includes a photoelectric conversion unit, a transfer transistor, and an amplification transistor. In the pixel unit, first and second pixel rows are arranged in a column direction. A first pixel row first pixel includes a first switch that changes a capacitance value at an input node of an amplification transistor included in the first pixel. A second pixel row second pixel includes a second switch that changes a capacitance value at an input node of an amplification transistor included in the second pixel. The buffer drives the first and second switches. A buffer output node is electrically connected to a first switch input node and a second switch input node to be common to the first switch input node and the second switch input node.

15 Claims, 16 Drawing Sheets

(56) References Cited

U.S. PATENT DOCUMENTS

| | | | |
|---|---|---|---|
| 2006/0208188 A1* | 9/2006 | Iida | G01J 5/02 250/330 |
| 2009/0244303 A1* | 10/2009 | Kinoshita | H04N 5/23245 348/218.1 |
| 2010/0259661 A1* | 10/2010 | Tejada | H04N 5/378 348/308 |
| 2010/0302422 A1* | 12/2010 | Ikuma | H04N 5/357 348/300 |
| 2011/0194007 A1* | 8/2011 | Kim | H04N 5/3575 348/308 |
| 2015/0049225 A1* | 2/2015 | Iwane | H04N 5/378 348/300 |
| 2015/0256777 A1* | 9/2015 | Ishii | H04N 5/363 250/208.1 |
| 2016/0006966 A1* | 1/2016 | Murakami | H04N 5/378 348/308 |
| 2017/0302861 A1* | 10/2017 | Shibata | H04N 5/265 |

\* cited by examiner

FIRST DIRECTION
SECOND DIRECTION

IMAGE CAPTURING DEVICE

BACKGROUND OF THE INVENTION

Field of the Invention

The disclosure relates to an image capturing device.

Description of the Related Art

A configuration has been known in which a capacitor is connected to an input node of an amplification transistor to increase a dynamic range of a signal output from a pixel.

Japanese Patent Laid-Open No. 2000-165754 discloses a configuration in which a drive line, through which a drive pulse is supplied to a switch for changing the capacitance of a floating diffusion disposed in a pixel, is disposed in each pixel row.

SUMMARY OF THE INVENTION

According to an aspect of the disclosure, as image capturing device includes a pixel unit in which a plurality of pixels are arranged in a matrix, each pixel of the plurality of pixels including a photoelectric conversion unit, a transfer transistor that transfers an electric charge accumulated in the photoelectric conversion unit, and an amplification transistor that receives the electric charge transferred by the transfer transistor at an input node, wherein, in the pixel unit, at least two pixel rows, each including a plurality of pixels arranged in a row direction, are arranged in a column direction different from the row direction, and the at least two pixel rows include a first pixel row and a second pixel row, wherein a first pixel of the first pixel row includes a first switch that changes a capacitance value at an input node of an amplification transistor included in the first pixel, and wherein a second pixel of the second pixel row includes a second switch that changes a capacitance value at an input node of an amplification transistor included in the second pixel, and a buffer that drives the first switch and the second switch, wherein an output node of the buffer is electrically connected to an input node of the first switch and an input node of the second switch so as to be common to the input node of the first switch and the input node of the second switch.

Further features of the disclosure will become apparent from the following description of embodiments with reference to the attached drawings.

DESCRIPTION OF THE EMBODIMENTS

First Embodiment

Figure 1:
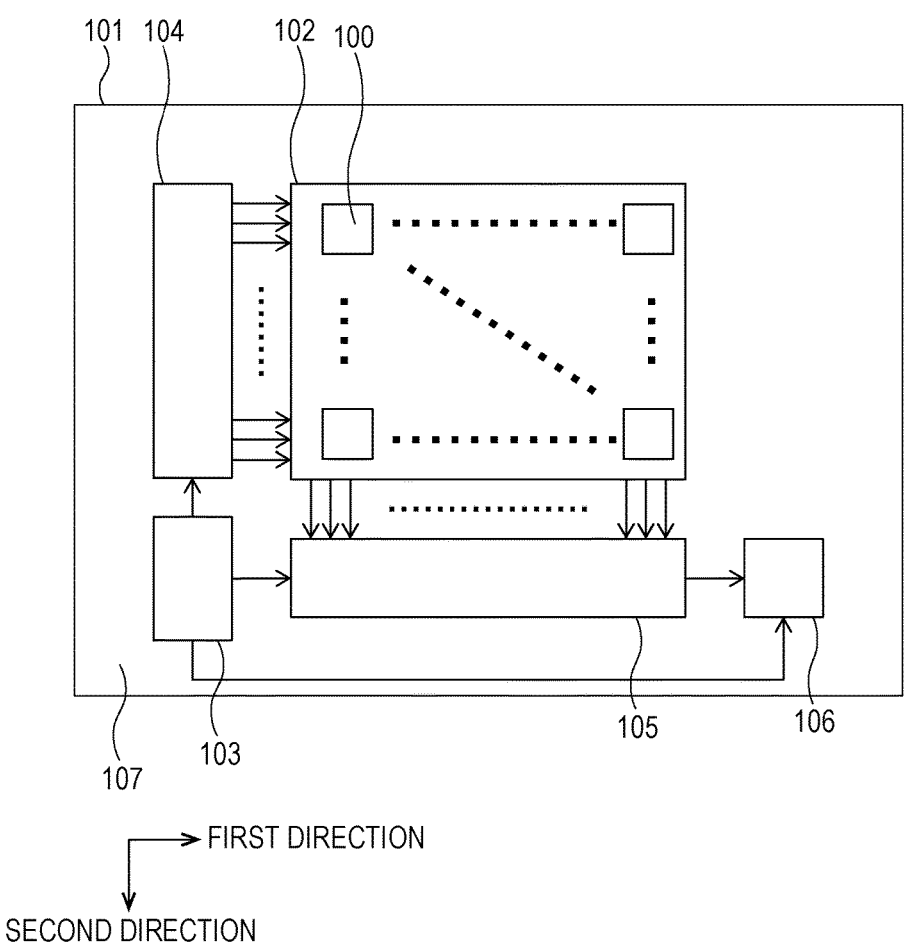
FIG. 1 is a block diagram of an image capturing device.

A first embodiment of an image capturing device that can be applied will be described with reference to FIGS. 1 to 5. In figures, elements or parts denoted by the same reference numerals are the same elements or regions.

FIG. 1 is a block diagram of an image capturing device 101 according to the first embodiment. The image capturing device 101 includes a pixel unit 102 and a peripheral circuit portion 107. The peripheral circuit portion 107 includes a drive pulse generation unit 103, a vertical scanning circuit 104, a signal processing unit 105, and an output unit 106.

In the pixel unit 102, a plurality of pixels 100 that each convert light into an electric signal and output the electric signal obtained by the conversion are arranged in a matrix. At least two pixel rows each including a plurality of pixels arranged in a first direction (a row direction in which pixels 100 of a row in the pixel unit 102 are arranged) are arranged in a second direction (a column direction in which pixels 100 of a column in the pixel unit 102 are arranged) that is different from the first direction.

The drive pulse generation unit 103 generates a drive pulse. The vertical scanning circuit 104 receives a control pulse from the drive pulse generation unit 103 and supplies a drive pulse to each pixel. The drive pulse generation unit 103 and the vertical scanning circuit 104 constitute a control unit that controls supply of a drive pulse.

The signal processing unit 105 receives signals output in parallel from the pixel unit 102. Then, the signal processing unit 105 serializes signals output in parallel from a plurality of pixel columns to transmit them to the output unit 106. Furthermore, the signal processing unit 105 may include column circuits that perform amplification of a signal, analog-to-digital (AD) conversion, and the like.

Figure 2:
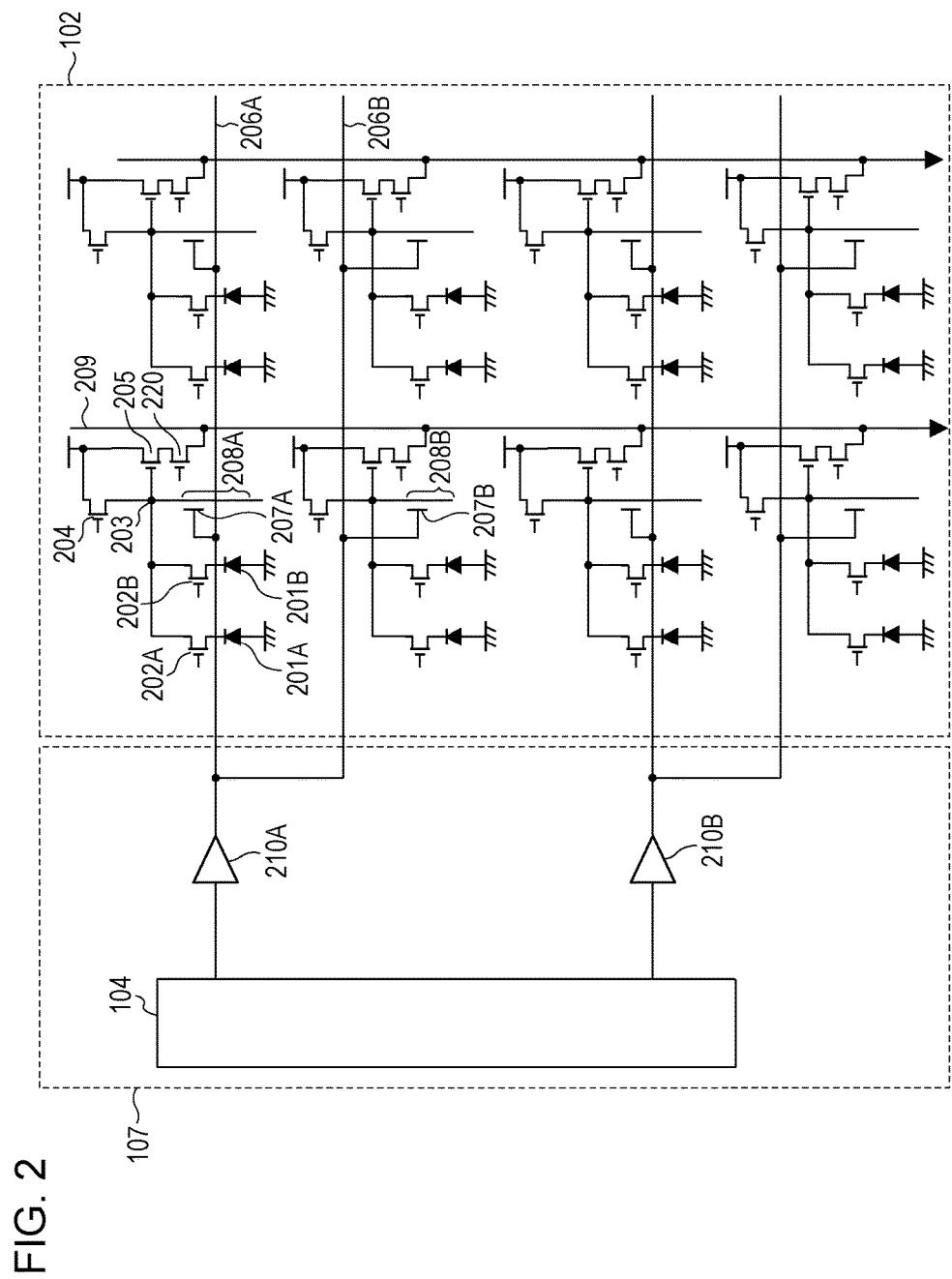
FIG. 2 is an equivalent circuit diagram of the image capturing device.

FIG. 2 illustrates an example of an equivalent circuit diagram of the image capturing device. In this embodiment, the polarity of a signal electric charge is called a first conductivity type. In this embodiment, as an example, although the first conductivity type and a second conductivity type that is an opposite conductivity type to the first conductivity type are respectively described as an N type and a P type, the first conductivity type and the second conductivity type are not limited to this and may respectively be a P type and an N type. Although suffixes A and B are used to distinguish between components, components having the same function are described without the suffixes. If both of the components have to be described so that they are distinguished from each other, they are described with the suffixes.

First, the configuration of each pixel will be described. A pixel 100 includes a plurality of photoelectric conversion units (photoelectric conversion unit 201A, photoelectric conversion unit 201B). In the photoelectric conversion units 201A and 201B, a charge pair is generated by photoelectric conversion. As the photoelectric conversion units 201A and 201B, for example, photodiodes are used.

A transfer transistor 202A transfers an electron generated in the photoelectric conversion unit 201A to a floating diffusion (hereinafter referred to as an FD) 203. A transfer transistor 202B transfers an electron generated in the photoelectric conversion unit 201B to the FD 203.

The FD 203 is shared by the photoelectric conversion unit 201A and the photoelectric conversion unit 201B. Then, the FD 203 holds electrons transferred from the photoelectric conversion unit 201A and the photoelectric conversion unit 201B via the transfer transistor 202A and the transfer transistor 202B.

An amplification transistor 205 whose gate electrode is electrically connected to the FD 203 amplifies a signal based on electrons transferred to the FD 203 via the transfer transistor 202A and the transfer transistor 202B and outputs the signal. More specifically, electrons transferred to the FD 203 are converted into a voltage based on the amount of the electrons, and an electric signal based on the voltage is output to the outside of the pixel 100 via the amplification transistor 205. The amplification transistor 205 constitutes a source follower circuit together with a current source which is not illustrated.

A reset transistor 204 resets a voltage at an input node of the amplification transistor 205 to a certain electric potential. A selection transistor 220 controls an output from the amplification transistor 205 to a signal line 209. A drain of the selection transistor 220 is connected to a source of the amplification transistor 205, and a source of the selection transistor 220 is connected to the signal line 209.

As an alternative to the configuration according to this embodiment, the selection transistor 220 may be provided between a drain of the amplification transistor 205 and a power supply line through which a power supply voltage is supplied. In any case, the selection transistor 220 controls electrical continuity between the amplification transistor 205 and the signal line 209.

A capacitor 208 constitutes part of the input node of the amplification transistor 205 in a connected state and is disconnected from the input node in a disconnected state. This allows a change in capacitance value at the input node of the amplification transistor 205. In this example, switching between connected and disconnected states of the capacitor 208 is controlled by a switch 207.

Parts of the capacitor 208 and the switch 207 may each serve as part of each other. For example, the capacitor 208 can be constituted by the capacitance of a gate insulating film of the switch 207. Furthermore, if the switch 207 is a metal-oxide-semiconductor (MOS) transistor, the capacitor 208 can be constituted by PN (positive-negative) junction capacitance and parasitic capacitance constituted by an N-type semiconductor region constituting a source. Note that parts of the capacitor 208 and the switch 207 do not each have to serve as part of each other and may be constituted by separate members.

When a drive pulse is supplied to an input node of the switch 207 to switch between an ON state (a connected state) and an OFF state (a disconnected state), a capacitance value at the input node of the amplification transistor 205 is switched between two or more values. For example, when the capacitor 208 is put into the disconnected state, a capacitance value at the input node of the amplification transistor 205 becomes a first value. Then, when the capacitor 208 is put into the connected state, a capacitance value at the input node of the amplification transistor 205 becomes a second value that is larger than the first value. Note that all switches 207 may be simultaneously switched between an ON state and an OFF state.

In the case where the capacitor 208 is put into the connected state, charge-voltage conversion efficiency at the input node of the amplification transistor 205 can be reduced in comparison with that in the disconnected state.

Thus, if a signal electric charge transferred to the input node of the amplification transistor 205 is constant, the magnitude of the voltage amplitude of a voltage into which the signal electric charge has been converted at the input node of the amplification transistor 205 is smaller than that in the case where a capacitance value is not increased. Because of this, even if a signal based on a high illumination level is input, the FD 203 is less likely to become saturated.

Contrarily, in the case where the capacitor 208 is put into the disconnected state to make a capacitance value at the input node of the amplification transistor 205 smaller than that in the connected state, charge-voltage conversion efficiency at the input node of the amplification transistor 205 is increased in comparison with that in the connected state.

Thus, if a transferred signal electric charge is constant, the magnitude of the voltage amplitude of a voltage into which the signal electric charge has been converted at the input node of the amplification transistor 205 is large, therefore increasing a signal-noise ratio in the case where noise whose amplitude has the same magnitude as the voltage amplitude occurs. Switching using the switch 207 and the capacitor 208 allows a change in dynamic range.

The switch 207 and the capacitor 208 do not have to be disposed in all pixels. In each of two pixel rows, at least one pixel 100 only has to include the switch 207 and the capacitor 208.

In FIG. 2, the amplification transistor 205 and the reset transistor 204 are shared by the photoelectric conversion unit 201A and the photoelectric conversion unit 201B of one pixel 100 of one pixel row. The pixel 100 having this configuration can output a signal for image capture and a signal used for a purpose other than image capture. Examples of a signal used for a purpose other than image capture include a signal for focus detection using a phase difference detection method, a signal for distance measurement, and a signal obtained by photoelectric conversion of light in a different wavelength region.

When a signal for image capture is obtained from the pixel 100, signal electric charges generated in the photoelectric conversion unit 201A and the photoelectric conversion unit 201B are transferred to the FD 203. Then, a signal based on the electric charges generated in two photoelectric conversion units 201A and 201B is output as a signal of the pixel 100 to the signal processing unit 105 via the signal line 209.

When a signal for focus detection is obtained, a signal based on a signal electric charge generated in the photoelectric conversion unit 201A or the photoelectric conversion unit 201B may be used as a signal of the pixel 100. After an electric charge of one of the two photoelectric conversion units 201A and 201B is transferred to the FD 203, the FD 203 is reset, and an electric charge of the other photoelectric conversion unit is transferred to the FD 203, thereby allowing signals of the two photoelectric conversion units to be obtained.

Alternatively, after an electric charge of one photoelectric conversion unit is transferred and a signal based on the electric charge is read out, an electric charge of the other photoelectric conversion unit is transferred with the electric charge of the one photoelectric conversion unit held in the FD 203, thereby allowing a signal of the two photoelectric conversion units to be obtained. After the signal of the two photoelectric conversion units is obtained, a signal of the other photoelectric conversion unit can be obtained by subtracting the previously output signal of the one photoelectric conversion unit.

Methods of outputting a signal for focus detection and a signal for image capture are not limited to the above-described methods. For example, a method is possible in which signals of the photoelectric conversion unit 201A and the photoelectric conversion unit 201B are output to the outside and then combined.

Although the configuration in which two photoelectric conversion units 201 and two transfer transistors 202 are disposed is described here, one or more photoelectric conversion units and one or more transfer transistors only have to be provided.

Next, as an example of this embodiment, at least two pixel rows arranged in the second direction will be described.

A pixel 100 of one pixel row (hereinafter referred to as a first pixel row) of two pixel rows includes a switch 207A (first switch) and a capacitor 208A (first capacitor). A pixel 100 of the other pixel row (hereinafter referred to as a second pixel row) includes a switch 207B (second switch) and a capacitor 208B (second capacitor).

The switch 207A may change only a capacitance value at the input node of the amplification transistor 205 disposed in the pixel 100 of the first pixel row. The switch 207B may change only a capacitance value at an input node of an amplification transistor disposed in the pixel 100 of the second pixel row.

Although FIG. 2 illustrates the configuration in which the first pixel row and the second pixel row are arranged adjacent to each other, they do not have to be adjacent to each other.

Next, the configuration of the image capturing device will be described. The image capturing device 101 includes the pixel unit 102 and the peripheral circuit portion 107. As described above, in the pixel unit 102, a plurality of pixel rows including a plurality of pixels arranged in the first direction are arranged in the second direction. FIG. 2 illustrates four pixel rows as an example.

In the peripheral circuit portion 107, the vertical scanning circuit 104 and a plurality of buffers 210 (buffer 210A, buffer 210B) are disposed. The vertical scanning circuit 104 is connected to the plurality of buffers 210. Then, each buffer 210 is electrically connected to switches 207 via a drive line 206 and drives each switch. Each buffer 210 is a circuit that performs a waveform shaping process, amplification, or impedance conversion on an electric signal. A signal output from the vertical scanning circuit 104 is subjected to any of the above-described processes, and the processed signal is supplied to each switch.

The buffer 210A supplies a drive pulse to the switch 207A of the pixel 100 of the first pixel row and the switch 207B of the pixel 100 of the second pixel row via a drive line 206A and a drive line 206B, respectively. That is, an output node of one buffer 210A is electrically connected to an input node of the switch 207A and an input node of the switch 207B so as to be common to the input nodes of the switches 207A and 207B.

The buffer 210B supplies a drive pulse to a plurality of switches, which correspond to the switch 207A and the switch 207B, included in pixels of a plurality of pixel rows (third pixel row, fourth pixel row) that are different from the first pixel row and the second pixel row.

In this embodiment, although one buffer is electrically connected to switches 207 (switch 207A, switch 207B) of two pixel rows so as to be common to the switches 207, the one buffer may be electrically connected to switches 207 of more than two pixel rows so as to be common to the switches 207.

Figure 3:
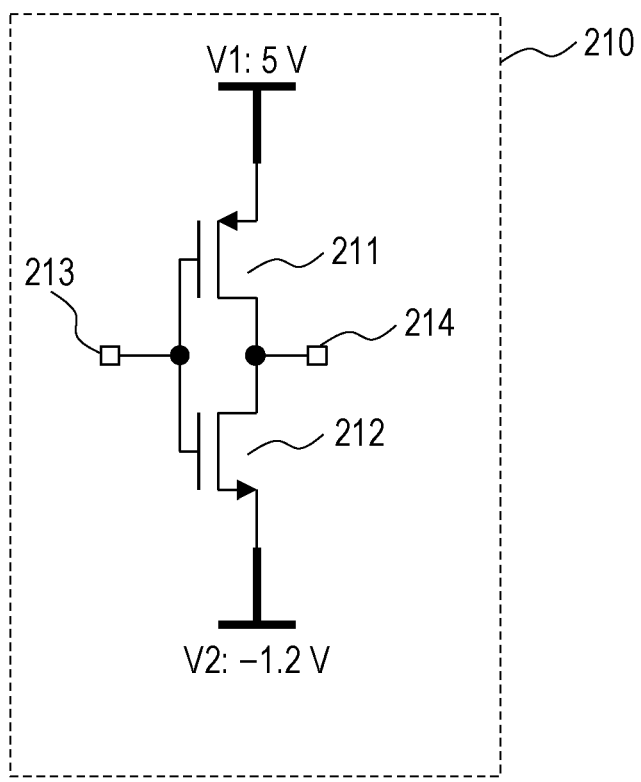
FIG. 3 is an equivalent circuit diagram of a buffer.

Next, FIG. 3 illustrates an example of an equivalent circuit diagram of each buffer 210. The buffer 210 includes a p-channel MOS (POS) transistor 211 and an n-channel MOS (NMOS) transistor 212.

An input node 213 that is a node equivalent to gates of the PMOS transistor 211 and the NMOS transistor 212 is connected to the vertical scanning circuit 104 illustrated in FIG. 2 and receives a drive pulse from the vertical scanning circuit 104. A power supply voltage V1 is supplied to a source of the PMOS transistor 211, and a drain of the PMOS transistor 211 is a node equivalent to an output node 214 of the buffer 210. The output node 214 is connected to the drive line 206 illustrated in FIG. 2. The power supply voltage V1 is 5 V, for example. Then, the drive line 206 is connected to the input nodes of the first switch and the second switch so as to be common to the control nodes.

A reference voltage V2 is supplied to a source of the NMOS transistor 212, and a drain of the NMOS transistor 212 is a node equivalent to the output node 214 of the buffer 210. The potential of the reference voltage V2 is lower than the potential of the power supply voltage V1. For example, the reference voltage V2 is at a ground potential or is a voltage of opposite sign to that of the power supply voltage V1. The reference voltage V2 is −1.2 V, for example.

When a drive pulse that puts the switches 207 illustrated in FIG. 2 into an ON state (a connected state) is supplied, the vertical scanning circuit 104 supplies a pulse with a potential equal to or lower than that of the reference voltage V2 to the input node 213 of the buffer 210. This puts the PMOS transistor 211 and the NMOS transistor 212 into an ON state and an OFF state, respectively, and thus the power supply voltage V1 is supplied to the output node 214. Then, the power supply voltage V1 is supplied from the output node 214 to the switches 207 via the drive line 206 to put the switches 207 into the ON state.

When a drive pulse that puts the switches 207 into an OFF state (a disconnected state) is supplied, the vertical scanning circuit 104 supplies a pulse with a potential equal to or higher than that of the power supply voltage V1 to the input node 213 of the buffer 210. This puts the PMOS transistor 211 and the NMOS transistor 212 into an OFF state and an ON state, respectively, and thus the reference voltage V2 is supplied to the output node 214. Then, the reference voltage V2 is supplied from the output node 214 to the switches 207 via the drive line 206 to put the switches 207 into the OFF state.

The buffer 210 herein shapes a waveform of a drive pulse output from the vertical scanning circuit 104 and works so that a weak pulse due to parasitic capacitance and/or parasitic resistance of lines returns to its original state. Although an inverter is taken as an example, a source follower circuit, a voltage follower circuit, and the like also can be used.

Figure 4:
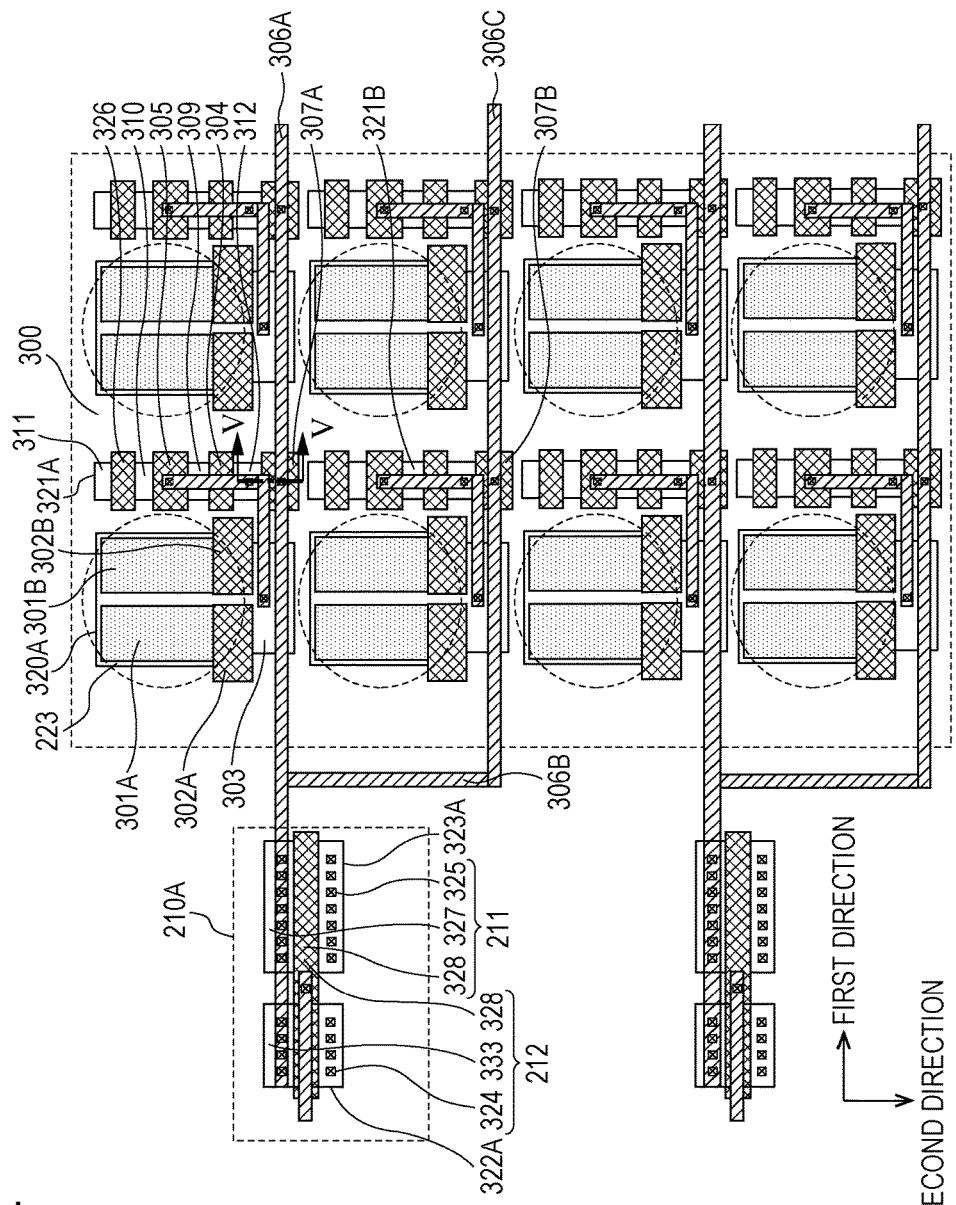
FIG. 4 is a schematic plan view.
Figure 5:
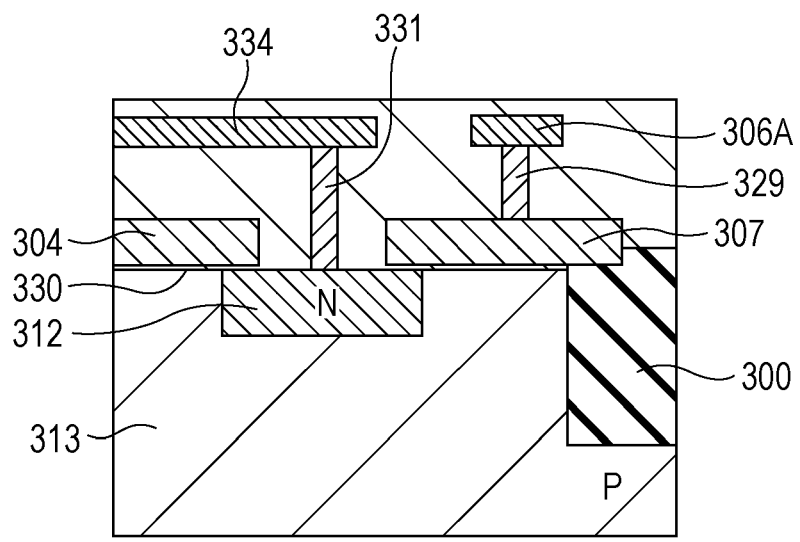
FIG. 5 is a schematic cross-sectional view.

Next, FIGS. 4 and 5 are respectively a schematic plan view and a schematic cross-sectional view of the image capturing device according to this embodiment. Here, the pixel unit includes four rows and two columns of pixels, for example.

First, pixels 100 of the first pixel row will be described. Semiconductor regions constituting the photoelectric conversion unit 201A, the photoelectric conversion unit 201B, the FD 203, and the transfer transistors 202 that are included in each pixel are disposed in a first active region 320. Semiconductor regions constituting the reset transistor 204, the amplification transistor 205, the selection transistor 220, the switch 207, and the capacitor 208 are disposed in a second active region 321.

Then, light passing through one microlens 223, which may be a small lens with a diameter less than a millimeter (mm) and as small as 10 micrometers (μm), enters the photoelectric conversion unit 201A and the photoelectric conversion unit 201B. Although the example is given in which only a plurality of photoelectric conversion units (photoelectric conversion units 201A and 201B) are disposed under the microlens 223 when viewed in plan, in addition to the plurality of photoelectric conversion units, at least part of an outer edge of one pixel may be disposed under the microlens 223. Although not illustrated, color filters are arranged under microlenses 223.

Although as example will be given in which a dielectric isolation portion 300 is disposed as a member that partitions active regions, a PN junction isolation portion may be disposed in place of or in addition to the dielectric isolation portion 300.

In a first active region 320A, an N-type semiconductor region 301A, an N-type semiconductor region 301B, and an N-type semiconductor region 303 are disposed. The N-tome semiconductor region 301A constitutes part of the photoelectric conversion unit 201A. The N-type semiconductor region 301B constitutes part of the photoelectric conversion unit 201B. The N-type semiconductor region 303 constitutes the ED 203.

A gate electrode 302A of the transfer transistor 202A and a gate electrode 302B of the transfer transistor 202B are disposed above the first active region 320A when viewed in plan. Then, the N-type semiconductor region 301A, the gate electrode 302A, and the N-type semiconductor region 303 constitute the transfer transistor 202A. The N-type semiconductor region 301B, the gate electrode 302B, and the N-type semiconductor region 303 constitute the transfer transistor 202B.

In a second active region 321A, an N-type semiconductor region 311, an N-type semiconductor region 310, an N-type semiconductor region 309, and an N-type semiconductor region 312 are disposed. Then, a gate electrode 326, a gate electrode 305, a gate electrode 304, and an electrode 307A are disposed above the second active region 321A when viewed in plan. Part of the electrode 307A is disposed on the dielectric isolation portion 300. Each electrode 307 is made of polysilicon, for example.

The N-type semiconductor region 311, the gate electrode 326, and the N-type semiconductor region 310 constitute the selection transistor 220. The N-type semiconductor region 310, the gate electrode 305, and the N-type semiconductor region 309 constitute the amplification transistor 205. The N-type semiconductor region 309, the gate electrode 304, and the N-type semiconductor region 312 constitute the reset transistor 204. Then, the electrode 307A is included in the switch 207A and constitutes the input node of the switch 207A.

The N-type semiconductor region 303, the N-type semiconductor region 312, and the gate electrode 305 are electrically connected and constitute the input node of the amplification transistor 205.

Next, a respect in which a pixel 100 of the second pixel row differs from the pixel 100 of the first pixel row will be described. An electrode 307B is disposed above a fourth active region 321B of the pixel 100 of the second pixel row, and the electrode 307B is included in the switch 207B and constitutes the input node of the switch 207B.

Next, each buffer 210 will be described. In an active region 322A, an N-type semiconductor region 324 and an N-type semiconductor region 333 are disposed. In a third active region 323A, a P-type semiconductor region 325 and a P-type semiconductor region 327 are disposed. Then, a gate electrode 328 is disposed above the active region 322A and the third active region 323A.

The N-type semiconductor region 324, the N-type semiconductor region 333, and the gate electrode 328 constitute the NMOS transistor 212. The P-type semiconductor region 325, the P-type semiconductor region 327, and the gate electrode 328 constitute the PMOS transistor 211. These transistors serve as an inverter that constitutes the buffer 210. A ground potential is supplied to the N-type semiconductor region 324, and a power supply voltage is supplied to the P-type semiconductor region 325. Then, a conductive pattern 306 constituting the drive line 206 is electrically connected to the N-type semiconductor region 333 and the P-type semiconductor region 327.

The drive line 206 illustrated in FIG. 2 includes a first conductive pattern 306A disposed in the first direction and a second conductive pattern 306B that branches off from the first conductive pattern 306A and is disposed in the second direction. The drive line 206 further includes a third conductive pattern 306C that branches off from the second conductive pattern 306B and is disposed in the first direction.

In this embodiment, the first conductive pattern 306A is connected to the output node of the buffer 210A and the electrode 307A constituting the switch 207A.

Between the third active region 323A in which the transistor constituting the buffer 210A is disposed and a pixel 100 disposed at a position closest to the buffer 210A, the second conductive pattern 306B branches off from the first conductive pattern 306A and is disposed in the second direction.

Between the third active region 323A and the pixel 100 disposed at the position closest to the buffer 210A, the third conductive pattern 306C branches off from the second conductive pattern 306B and is connected to the electrode 307B constituting the switch 207B.

Then, the second conductive pattern 306B electrically connects the first conductive pattern 306A to the third conductive pattern 306C.

Of adjacent pixel rows, between an N-type semiconductor region 301 of a pixel 100 of the first pixel row and an N-type semiconductor region 301 of a pixel 100 of the second pixel row, the first conductive pattern 306A and the third conductive pattern 306C are disposed.

Next, FIG. 5 is a schematic cross-sectional view taken along line V-V of FIG. 4. An example of the configuration of the capacitor 208 that is electrically connected to the input node by putting the switch 207 into an ON state will be described.

In FIG. 5, the N-type semiconductor region 312 and the dielectric isolation portion 300 are disposed adjacent to each other with the electrode 307 interposed therebetween. The N-type semiconductor region 312 is electrically connected to the FD 203 via a contact plug 331 and a line 334. The electrode 307 is electrically connected to the first conductive pattern 306A via a contact plug 329.

In the example of FIG. 5, in a semiconductor region below the electrode 307, a surface-channel MOS capacitor that is a charge accumulation region obtained by inversion of a P-type semiconductor region 313 disposed on the surface of the active region below the electrode 307 due to an electric field applied via an insulating film 330 is formed. A drive pulse applied to the electrode 307 via the first conductive pattern 306A switches between an inversion state and a non-inversion state of the P-type semiconductor region 313. This allows switching between an electrically connected state and an electrically disconnected state of the capacitor 208 to and from the FD 203. On the surface of the active region below the electrode 307, an N-type semiconductor region can be disposed, thereby providing a buried-channel MOS capacitor.

In this embodiment, although the electrode 307 is disposed so that part thereof overlaps the dielectric isolation portion 300 when viewed in plan, the electrode 307 does not have to overlap the dielectric isolation portion 300.

Furthermore, between the electrode 307 and the dielectric isolation portion 300 when viewed in plan, an N-type semiconductor region or a P-type semiconductor region may be disposed.

If a P-type semiconductor region is disposed, the N-type semiconductor region 312 and the P-type semiconductor region are disposed adjacent to each other with the electrode 307 interposed therebetween.

If an N-type semiconductor region is disposed, the N-type semiconductor region 312 and the N-type semiconductor region are disposed adjacent to each other with the electrode 307 interposed therebetween. The N-type semiconductor region, the electrode 307, and the N-type semiconductor region 312 constitute a transistor.

In this embodiment, as illustrated in FIG. 2, the one buffer 210A drives the switch 207A and the switch 2071B connected to the input nodes of the amplification transistors of their respective different pixel rows. Such a configuration allows a reduction in the number of buffers in comparison with the case where a buffer is disposed for each of a plurality of pixel rows in which pixels including switches 207 are arranged, thereby allowing a reduction in the area of the peripheral circuit portion 107.

In this embodiment, although the configuration in which one pixel of a plurality of pixels 100 includes one amplification transistor 205 is described, any configuration in which, for example, a plurality of pixels share one amplification transistor 205 can be applied.

Second Embodiment

Figure 6:
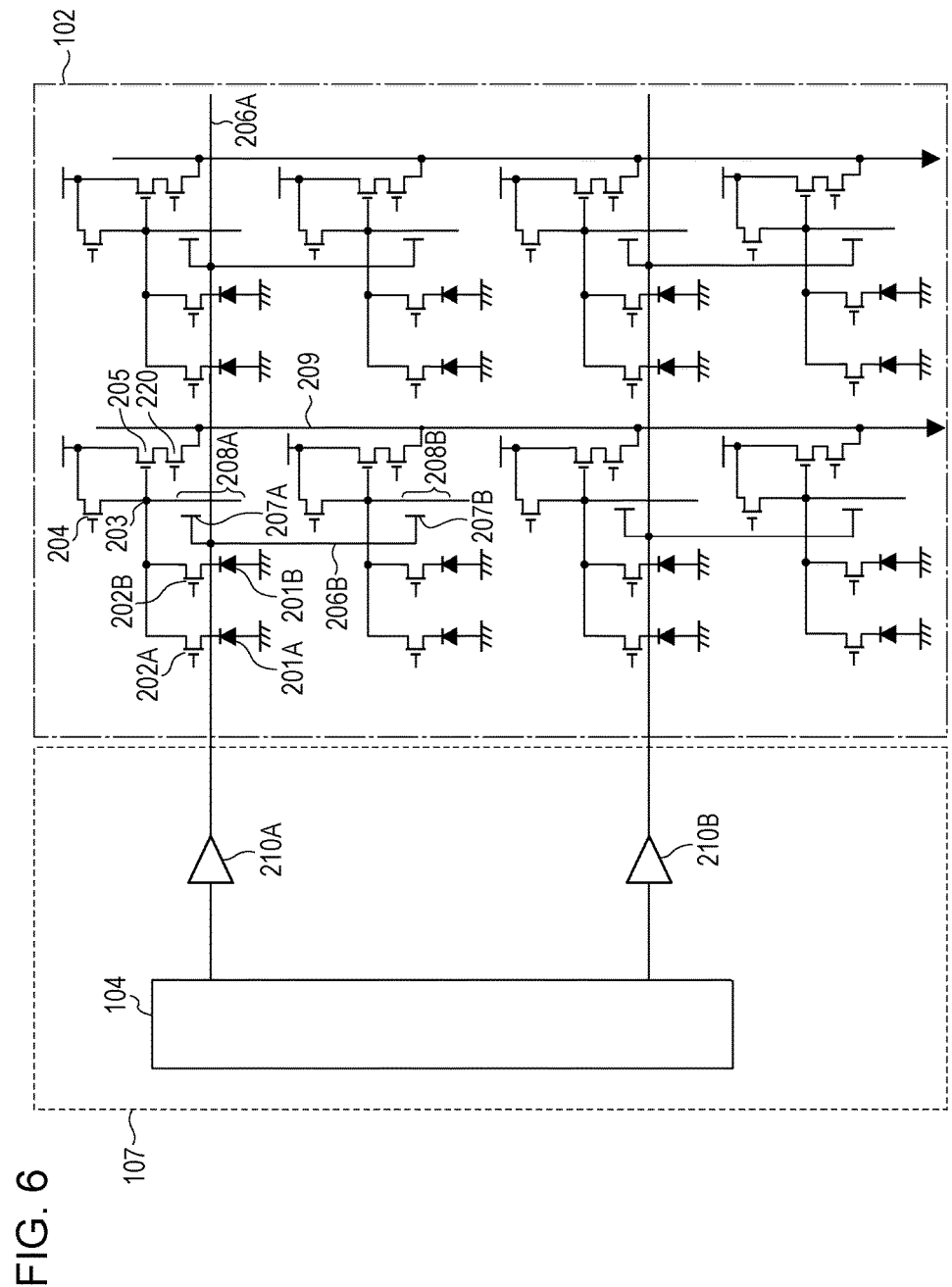
FIG. 6 is an equivalent circuit diagram of an image capturing device.
Figure 7:
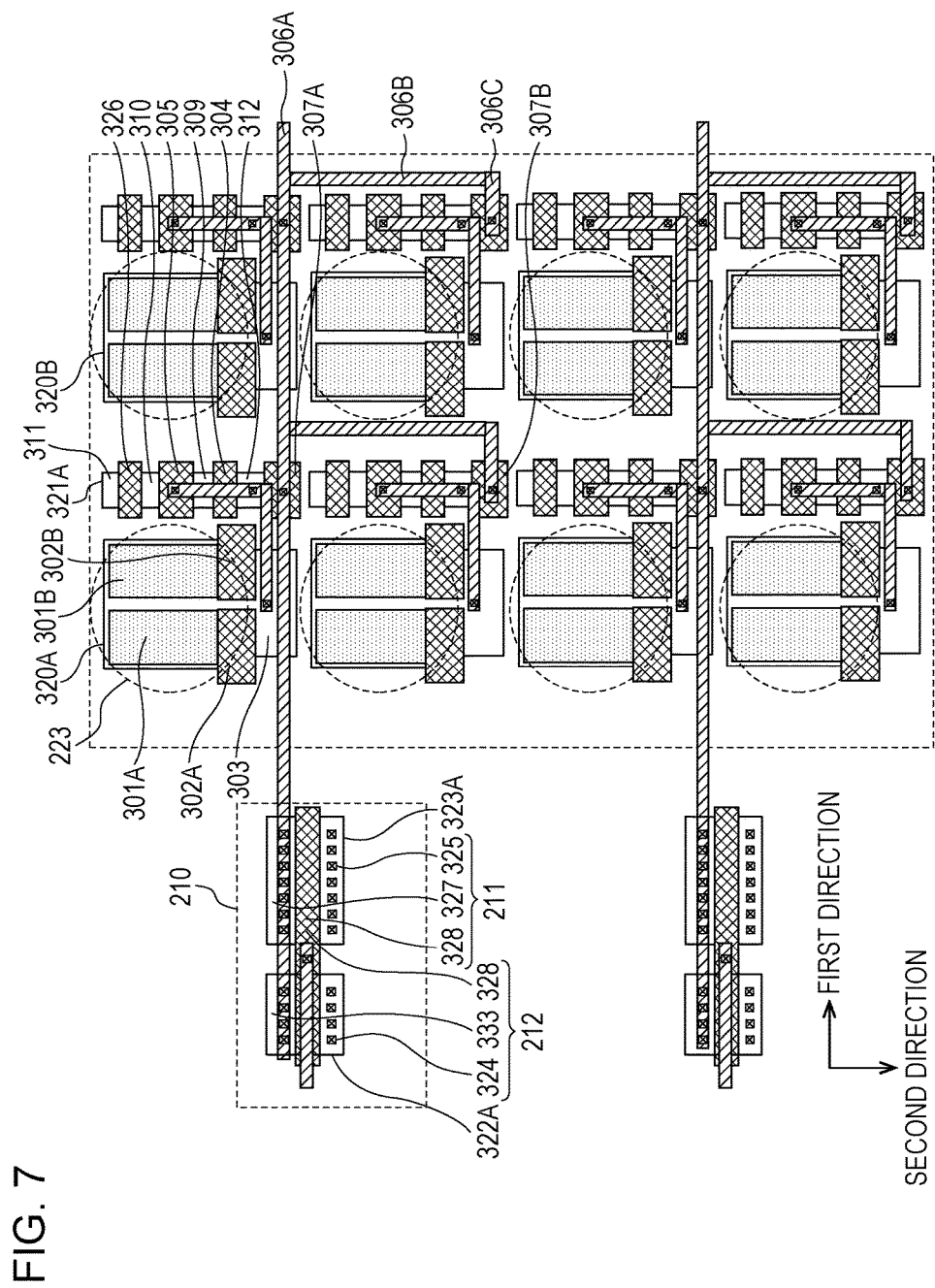
FIG. 7 is a schematic plan view.
Figure 8:
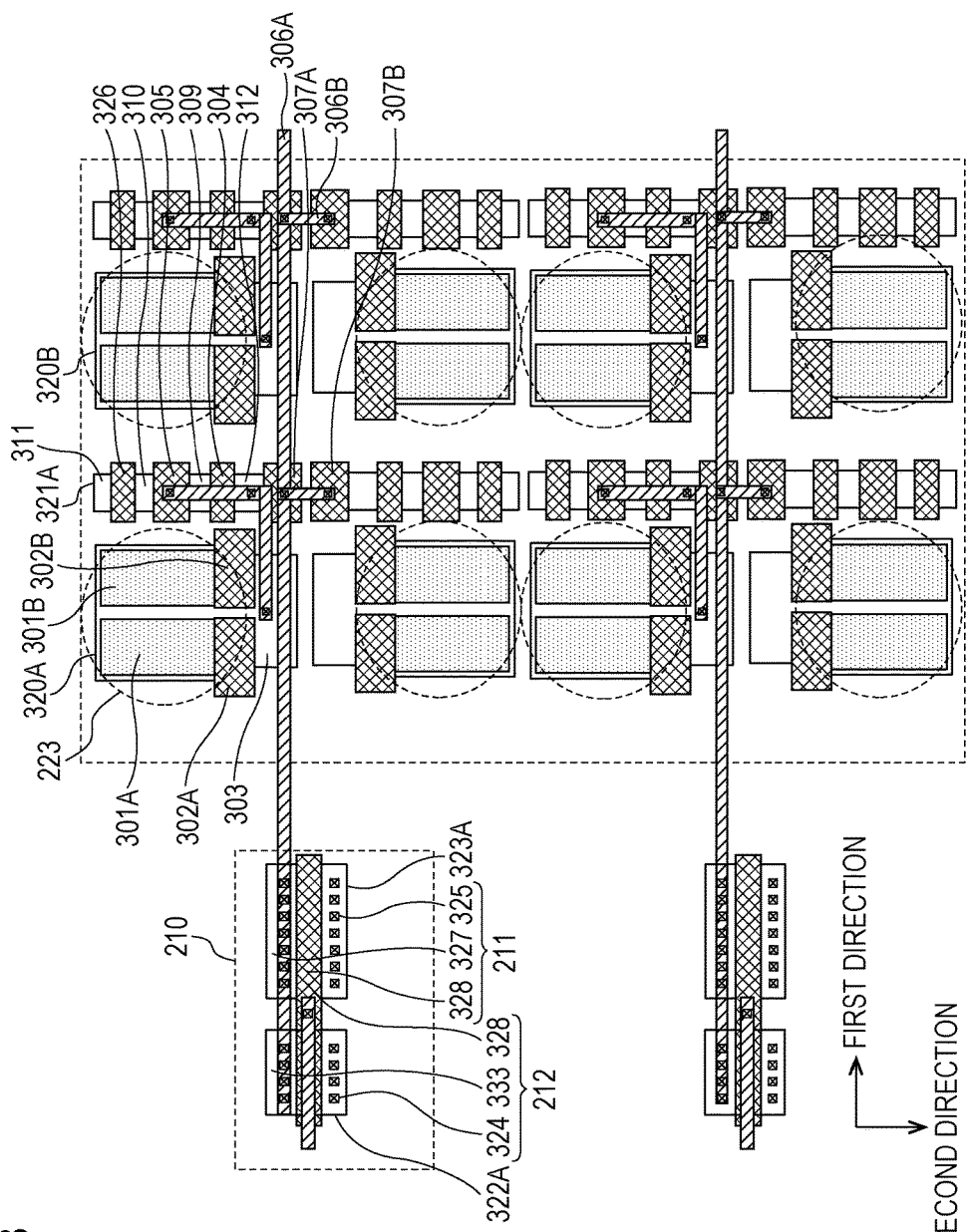
FIG. 8 is a schematic plan view.

FIGS. 6 to 8 are an equivalent circuit diagram and schematic plan views illustrating features of an image capturing device according to a second embodiment. Components having the same functions as those illustrated in FIGS. 1 to 5 are denoted by the same reference numerals, and detailed descriptions thereof are omitted.

FIG. 6 is an equivalent circuit diagram of the image capturing device according to the second embodiment. This embodiment differs from the first embodiment in terms of a position from which the drive line 206 branches off.

FIG. 7 is a schematic plan view of the image capturing device 101 according to this embodiment. The configuration of each pixel is the same as that illustrated in FIG. 4. In this embodiment, between first active regions of two pixels that are included in the same pixel row and arranged adjacent to each other, the second conductive pattern 306B branches off from the first conductive pattern 306A.

In FIG. 7, in two adjacent pixels of the same pixel row, the first active region 320A and the second active region 321A of one pixel, and a first active region 320B of the other pixel are sequentially arranged in that order in the first direction.

In this embodiment, between the second active region 321A of the one pixel and the first active region 320B of the other pixel, the second conductive pattern 306B branches off from the first conductive pattern 306A and is disposed in the second direction. Then, between the second active region 321A of the one pixel and the first active region 320B of the other pixel, the third conductive pattern 306C branches off from the second conductive pattern 306B and is disposed in the first direction.

Also, in this embodiment, the first conductive pattern 306A is connected to the output node of the buffer 210A and the electrode 307A constituting the switch 207A. The third conductive pattern 306C electrically connects the second conductive pattern 306B to the electrode 307B constituting the switch 207B.

A configuration like that in this embodiment has the effect of allowing a reduction in the number of drive lines extending toward switches 207 from the peripheral circuit portion 107 to the pixel unit 102 in addition to the effect of the first embodiment, thereby allowing a reduction in the size of the peripheral circuit portion 107.

First Modification

FIG. 8 illustrates a modification of the second embodiment. FIG. 8 differs from FIG. 7 in terms of the fact that the first pixel row and the second pixel row are arranged adjacent to each other and that each pixel of the first pixel row and each pixel of the second pixel row are arranged to have mirror symmetry.

Such a configuration allows electrodes 307 constituting respective switches 207 of pixels of adjacent pixel rows to be disposed close to each other in comparison with the configuration of FIG. 7. That is, the length of the second conductive pattern 306B can be shortened. Thus, the density of lines in the pixel unit 102 is reduced, thereby allowing an increase in the aperture area of each pixel and having the effect of allowing an increase in the sensitivity of each photoelectric conversion unit 201 in addition to the effect of the second embodiment.

In this modification, although the second conductive pattern 306B is connected to the electrode 307B, the third conductive pattern 306C may be disposed as illustrated in FIG. 7, and the third conductive pattern 306C branching off from the second conductive pattern 306B may be connected to the electrode 307B.

This modification is applicable to other embodiments.

Third Embodiment

Figure 9:
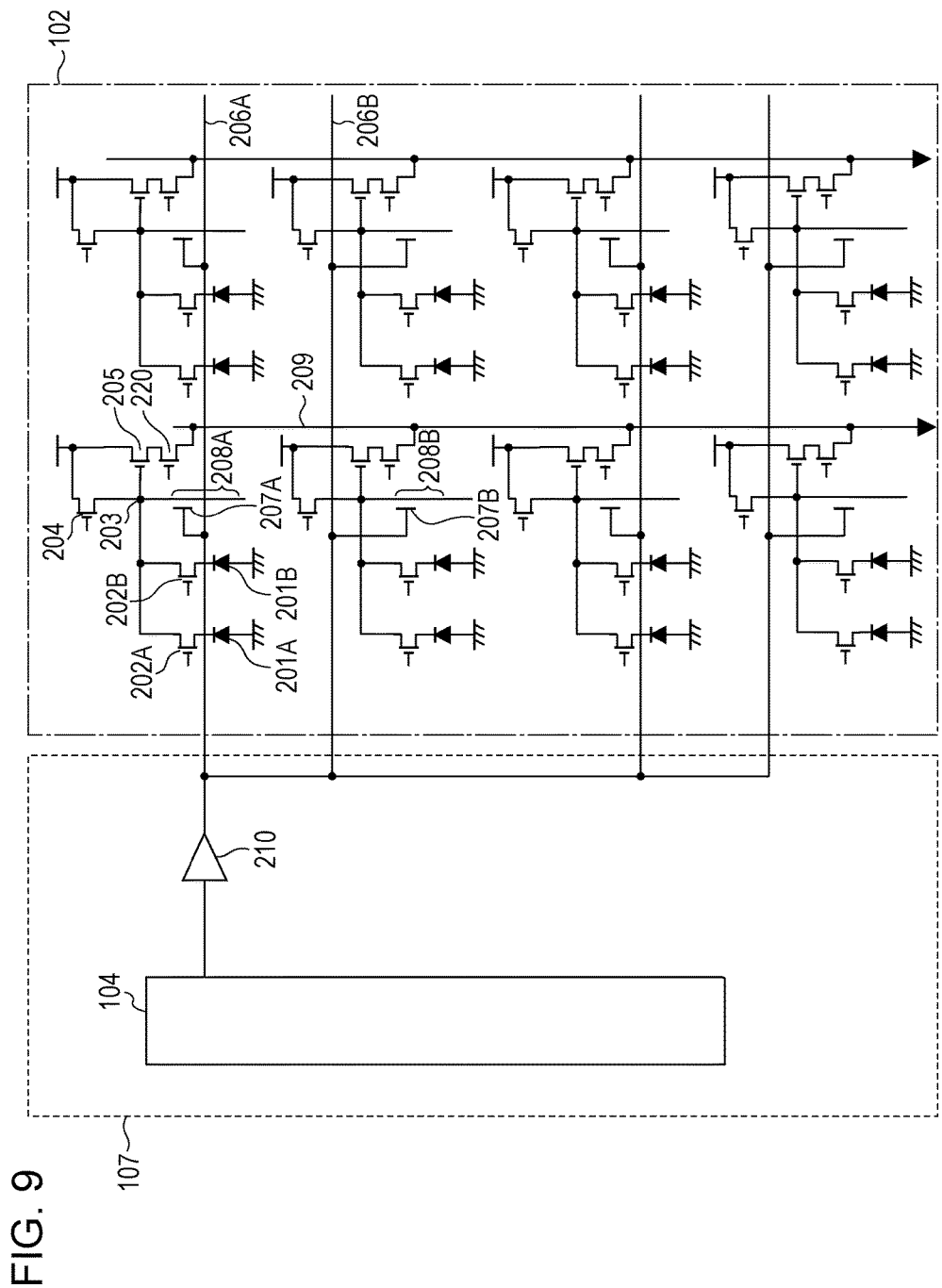
FIG. 9 is an equivalent circuit diagram of an image capturing device.
Figure 10:
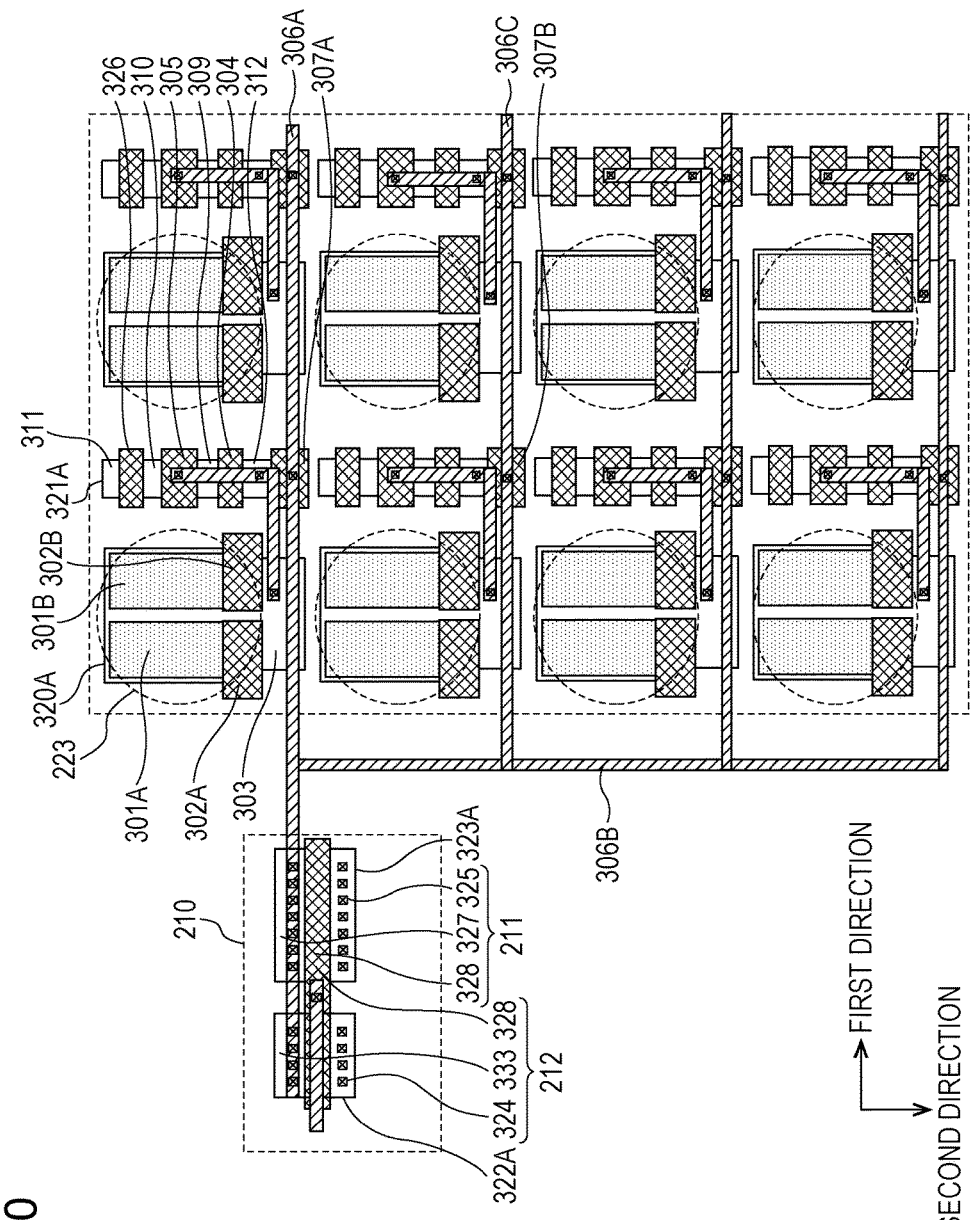
FIG. 10 is a schematic plan view.

FIGS. 9 and 10 are an equivalent circuit diagram and a schematic plan view illustrating features of an image capturing device according to a third embodiment. Components having the same functions as those illustrated in FIGS. 1 to 5 are denoted by the same reference numerals, and detailed descriptions thereof are omitted.

FIG. 9 is an equivalent circuit diagram of the image capturing device according to the third embodiment. This embodiment differs from the first embodiment in terms of the number of buffers 210. In this embodiment, one buffer 210 is provided so as to be common to switches 207 of pixels of all pixel rows.

FIG. 10 is a schematic plan view of the image capturing device according to this embodiment. In this embodiment, the image capturing device includes the first conductive pattern 306A disposed in the first direction and the second conductive pattern 306B that branches off from the first conductive pattern 306A and is disposed in the second direction. The image capturing device further includes a plurality of conductive patterns that branch off from the second conductive pattern 306B and are disposed in the first direction, and the plurality of conductive patterns include the third conductive pattern 306C.

One buffer 210 may be provided so as to be common to switches 207 (electrodes 307) of pixels 100 of all pixel rows. That is, all of the first conductive pattern 306A, the second conductive pattern 306B, and the plurality of conductive patterns including the third conductive pattern 306C may be electrically connected to the one buffer 210.

Between the third active region 323A in which the transistor constituting the one buffer 210 is disposed and a pixel 100 disposed at a position closest to the one buffer 210 among pixels 100 arranged in the pixel unit 102, the second conductive pattern 306B branches off from the first conductive pattern 306A and is disposed in the second direction.

Similarly, between the third active region 323A in which the transistor constituting the one buffer 210 is disposed and the pixel 100 disposed at the position closest to the one buffer 210 among pixels 100 arranged in the pixel unit 102, each of the plurality of conductive patterns including the third conductive pattern 306C branches off from the second conductive pattern 306B and is disposed in the first direction.

Then, of adjacent pixel rows, between the N-type semiconductor region 301 of a pixel 100 of the first pixel row and the N-type semiconductor region 301 of a pixel 100 of the second pixel row, the first conductive pattern 306A and each of the plurality of conductive patterns including the third conductive pattern 306C are disposed.

In this embodiment, as illustrated in FIG. 9, the one buffer 210 is provided so as to be common to all pixel rows in which pixels including switches 207 are arranged.

Such a configuration allows a reduction in the number of buffers 210 in comparison with the case where the buffer 210 is disposed for each of a plurality of pixel rows in which pixels including switches 207 are arranged, thereby allowing a reduction in the area of the peripheral circuit portion 107.

Fourth Embodiment

FIGS. 11 to 16 are an equivalent circuit diagram, schematic plan views, and a schematic cross-sectional view illustrating features of an image capturing device according to a fourth embodiment. Components having the same functions as those illustrated in FIGS. 1 to 5 are denoted by the same reference numerals, and detailed descriptions thereof are omitted.

Figure 11:
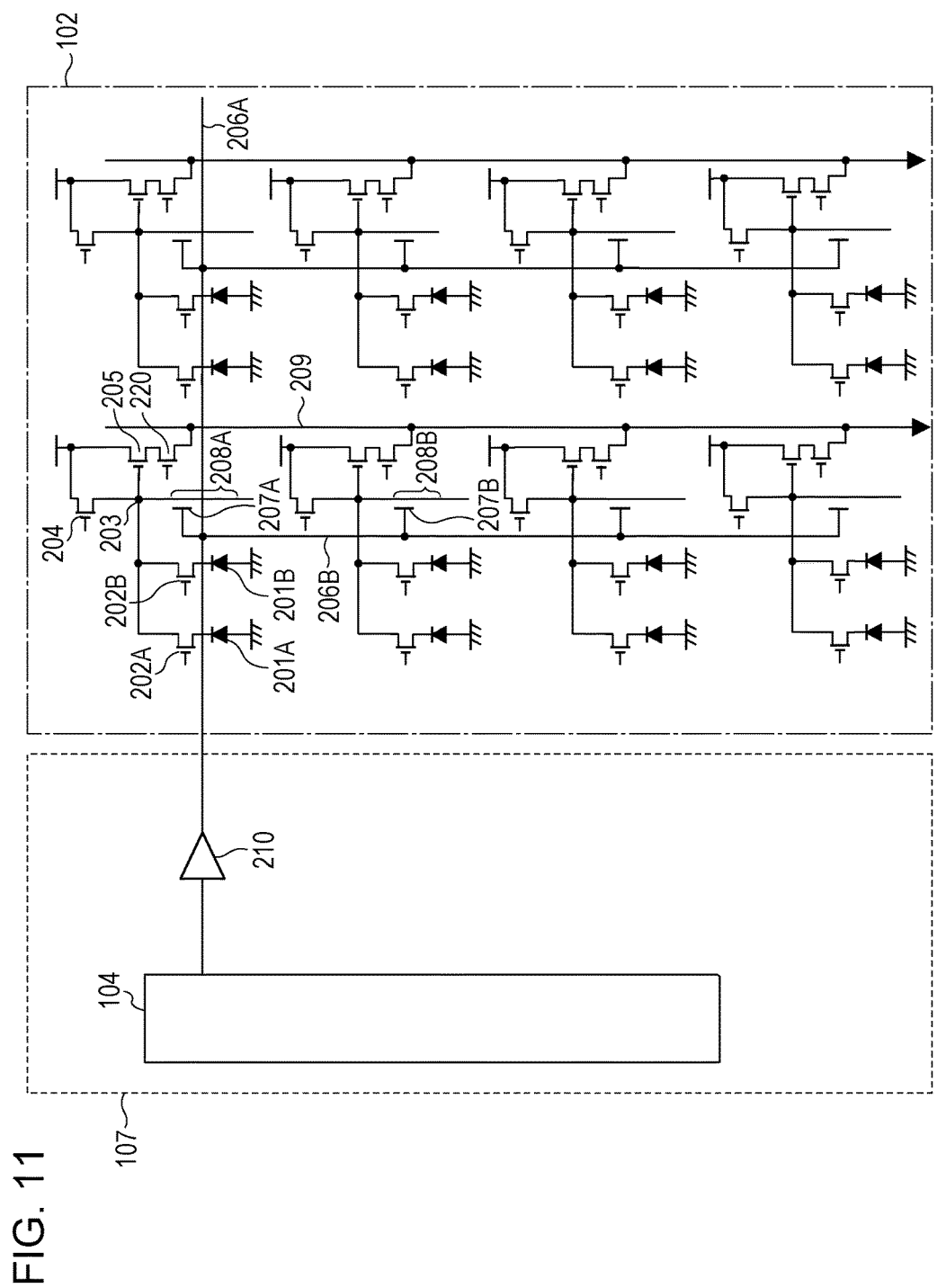
FIG. 11 is an equivalent circuit diagram of an image capturing device.

FIG. 11 is an equivalent circuit diagram of the image capturing device according to the fourth embodiment. In this embodiment as well as in the third embodiment, one buffer 210 is provided so as to be common to switches 207 of pixels 100 of all pixel rows and supplies a drive pulse that drives the switches 207 of the pixels 100 of all the pixel rows. This embodiment differs from the third embodiment in terms of a position from which the drive line 206 branches off.

Figure 12:
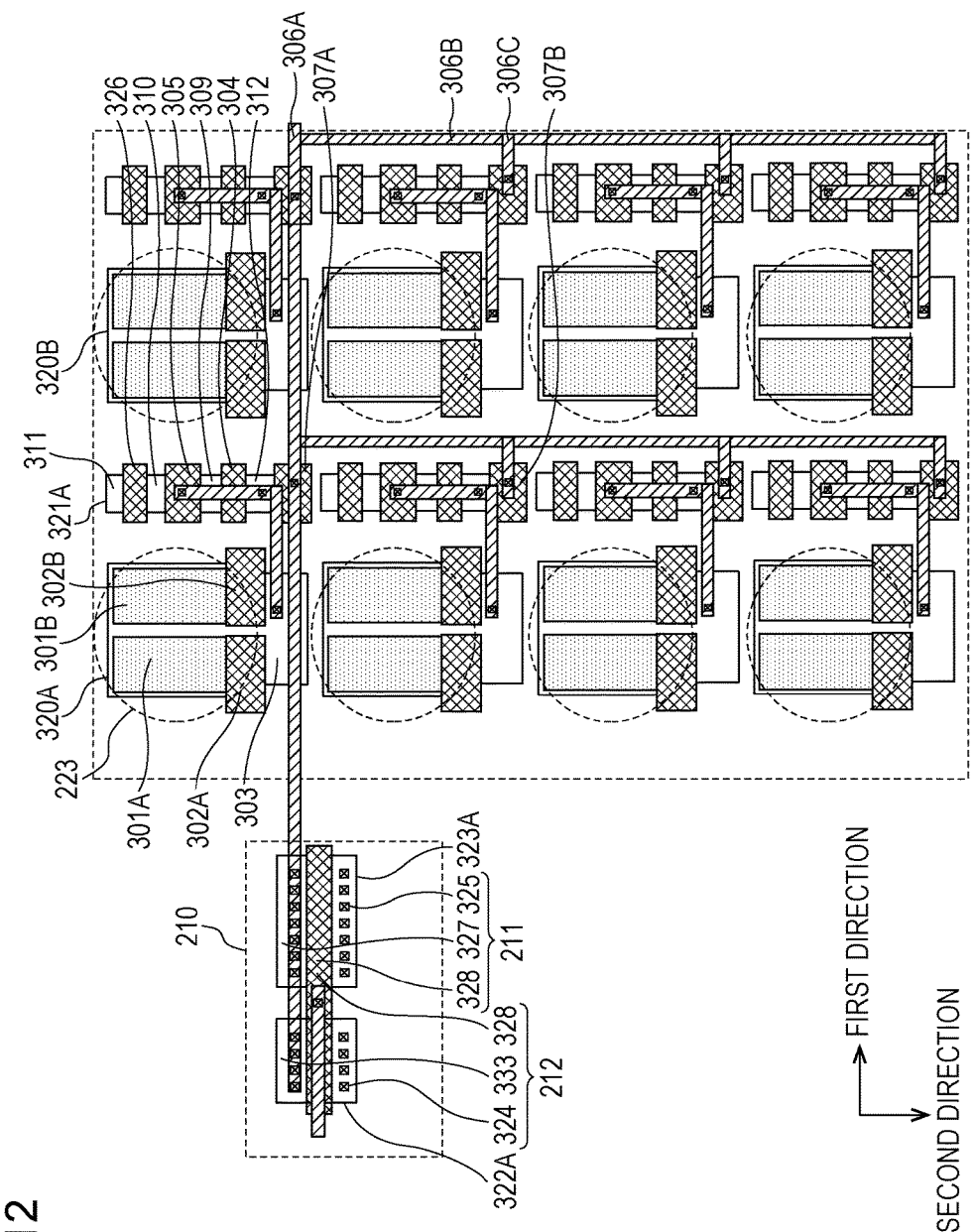
FIG. 12 is a schematic plan view.

FIG. 12 is a schematic plan view of the image capturing device 101 according to this embodiment. The configuration of each pixel is the same as that illustrated in FIG. 4. In this embodiment, between first active regions 320 of two pixels that are included in the same pixel row and arranged adjacent to each other, the second conductive pattern 306B branches off from the first conductive pattern. 306A.

In this embodiment as well as in the third embodiment, one buffer 210 is provided so as to be common to switches 207 (electrodes 307) of pixels 100 of all pixel rows. That is, all of the first conductive pattern 306A, the second conductive pattern 306B, and a plurality of conductive patterns including the third conductive pattern. 306C may be electrically connected to the one buffer 210.

Also, in FIG. 12, in two adjacent pixels of the same pixel row, the first active region 320A and the second active region 321A of one pixel, and the first active region 320B of the other pixel are sequentially arranged in that order in the first direction.

Then, in FIG. 12, between the second active region 321A of the one pixel and the first active region 320B of the other pixel, the second conductive pattern 306B branches off from the first conductive pattern 306A. Similarly, in this embodiment, between the second active region 321A of the one pixel and the first active region 320B of the other pixel, the plurality of conductive patterns including the third conductive pattern 306C branch off from the second conductive pattern 306B.

Thus, this embodiment differs from the third embodiment in terms of a position where the second conductive pattern 306B branches off from the first conductive pattern 306A. This embodiment further differs from the third embodiment in terms of a position where the plurality of conductive patterns including the third conductive pattern 306C branch off from the second conductive pattern 306B.

A configuration like that in this embodiment has the effect of allowing a reduction in the number of drive lines disposed in a portion overlapping the peripheral circuit portion 107 when viewed in plan in addition to the effect of the third embodiment, thereby allowing a reduction in the size of the peripheral circuit portion 107.

First Modification

Figure 13:
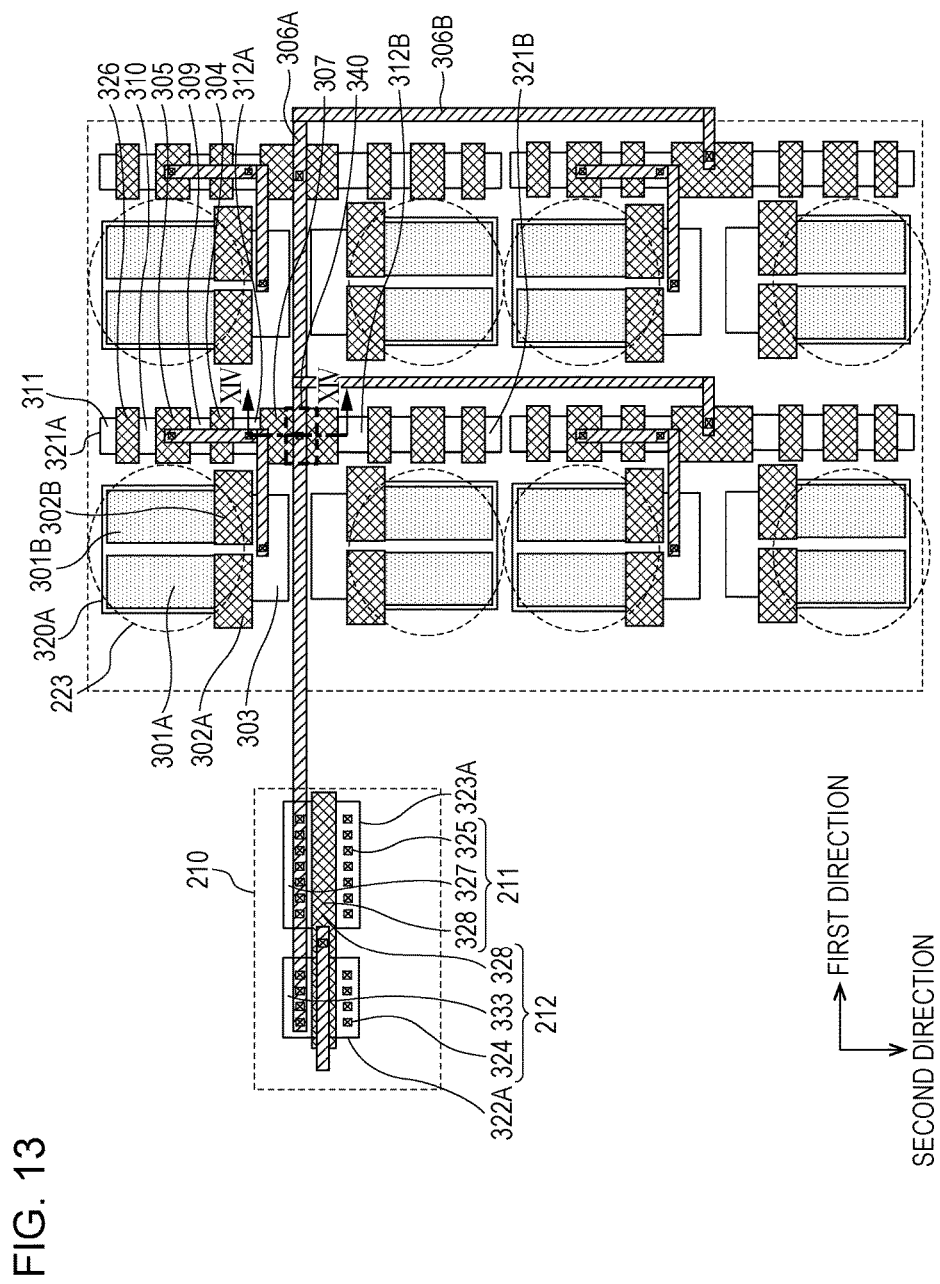
FIG. 13 is a schematic plan view.
Figure 14:
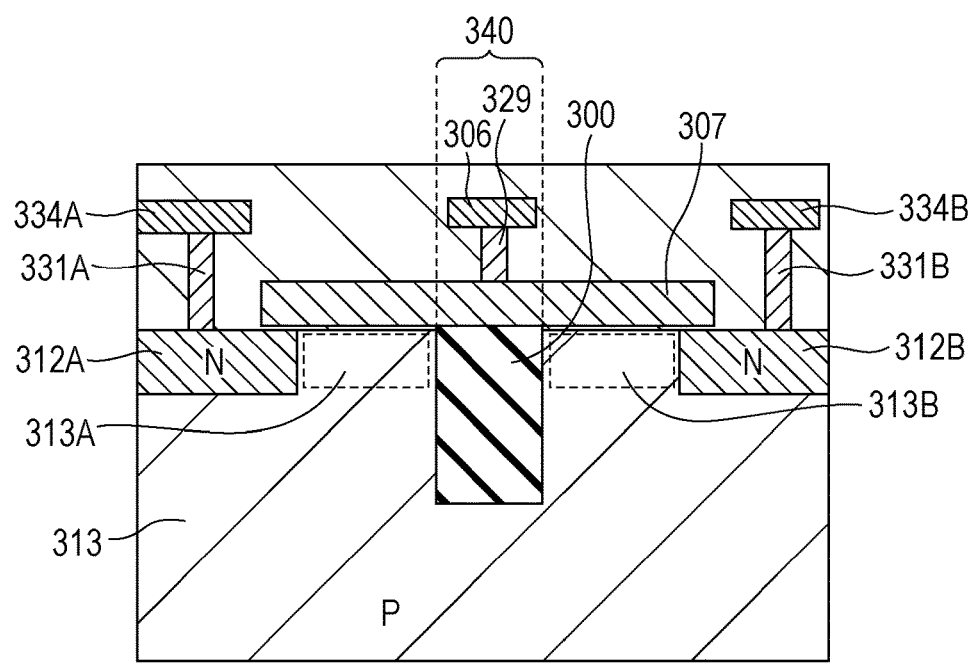
FIG. 14 is a schematic cross-sectional view.

FIGS. 13 and 14 each illustrate a modification of the fourth embodiment. FIG. 13 differs from FIG. 12 in terms of the fact that two pixels of adjacent pixel rows that are adjacent to each other in the second direction share the electrode 307 constituting the respective switches 207. At this time, as in FIG. 8, pixels of the adjacent pixel rows may have mirror symmetry.

In FIG. 13, the electrode 307 is disposed on the dielectric isolation portion 300 disposed in a region 340. The electrode 307 extends out over the second active region 321A and the fourth active region 321B that are disposed adjacent to each other with the dielectric isolation portion 300 interposed therebetween. Then, the output node of the buffer 210 is electrically connected to one electrode 307.

Next, FIG. 14 is a schematic cross-sectional view taken along line XIV-XIV of FIG. 13. In this modification, an N-type semiconductor region 312A (first semiconductor region) disposed in the second active region 321A and an N-type semiconductor region 312B (second semiconductor region) disposed in the fourth active region 321B are disposed adjacent to each other with the electrode 307 interposed therebetween when viewed in plan. At this time, the electrode 307 may overlap parts of the N-type semiconductor region 312A and the N-type semiconductor region 312B when viewed in plan.

Between the dielectric isolation portion 300 and the N-type semiconductor region 312A, a P-type semiconductor region 313A is disposed, and between the dielectric isolation portion 300 and the N-type semiconductor region 312B, a P-type semiconductor region 313B is disposed.

Thus, a drive pulse applied to the electrode 307 via the first conductive pattern 306A switches between an inversion state and a non-inversion state of the P-type semiconductor region 313A and the P-type semiconductor region 313B. In the case of inversion, a surface-channel MOS capacitor that is a charge accumulation region obtained by inversion of the P-type semiconductor region 313 disposed on the surface of the active region below the electrode 307 is formed.

A surface-channel MOS capacitor formed with the P-type semiconductor region 313A is the capacitor 208A connected to an input node of a pixel 100 of the first pixel row of adjacent pixel rows. A surface-channel MOS capacitor formed with the P-type semiconductor region 313B is the capacitor 208B connected to an input node of a pixel 100 of the second pixel row. Between the capacitor 208A and the capacitor 208B, the dielectric isolation portion 300 is disposed, and the capacitor 208A and the capacitor 208B are electrically isolated to not be electrically connected to each other.

On surface portions of the P-type semiconductor region 313A and the P-type semiconductor region 313B, N-type semiconductor regions may be disposed, thereby providing buried-channel MOS capacitors.

In such a configuration, since the electrode 307 is common to pixels of adjacent pixel rows, a common first conductive pattern 306A can be provided. That is, the second conductive pattern 306B and the third conductive pattern 306C can be removed. Thus, the density of lines in the pixel unit 102 is reduced, thereby allowing an increase in the aperture area of each pixel and having the effect of allowing an increase in sensitivity in addition to the effect of the fourth embodiment.

This modification is applicable to other embodiments.

Second Modification

Figure 15:
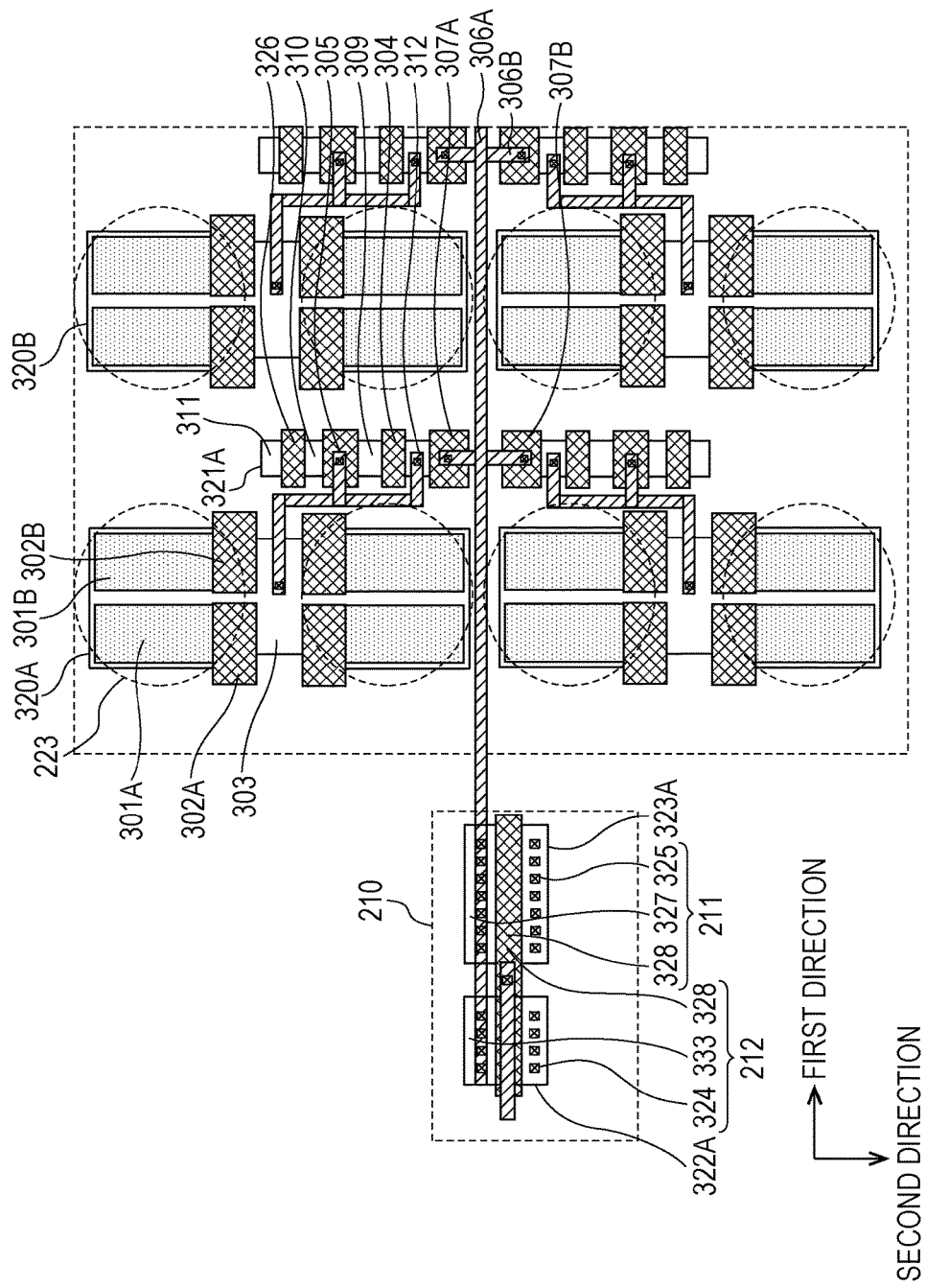
FIG. 15 is a schematic plan view.

FIG. 15 illustrates a modification of the fourth embodiment. FIG. 15 differs from FIG. 12 in terms of the fact that pixels of adjacent pixel rows share the N-type semiconductor region 303 constituting respective FDs 203 and also share the input node.

In such a configuration, one amplification transistor 205, one reset transistor 204, and one switch 207 only have to be disposed for a plurality of pixels. That is, the number of second active regions 321 can be reduced. Thus, the aperture area of each pixel can be increased, thereby allowing an increase in sensitivity.

This modification is applicable to other embodiments.

Third Modification

Figure 16:
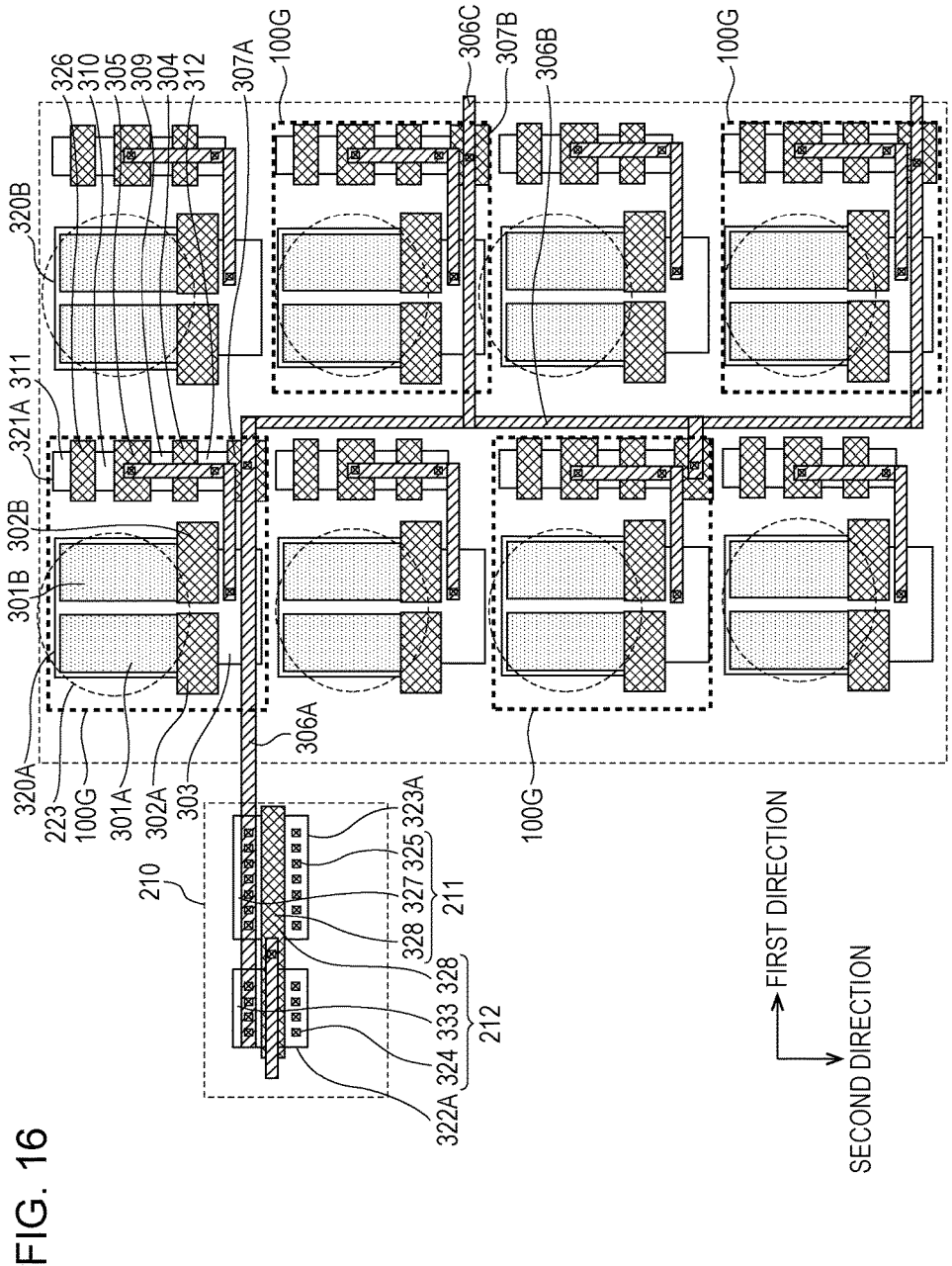
FIG. 16 is a schematic plan view.

FIG. 16 illustrates a modification of the fourth embodiment. This modification differs from the other modifications in terms of the fact that, among pixels of each pixel row, only a pixel having a color filter of green includes the capacitor 208 and the switch 207.

In FIG. 16, pixels 100G having a color filter of green are located at the first row and first column, at the second row and second column, at the third row and first column, and at the fourth row and second column. The other pixels have a color filter of red or a color filter of blue and do not include the capacitor 208 and the switch 207.

This is because the sensitivity of a pixel having the color filter of green is higher than those of a pixel having the color filter of red and a pixel having the color filter of blue, and thus an electric charge is more likely to be generated and a voltage at a portion subsequent to the signal line 209 is more likely to become saturated. Thus, only in the pixels 100G having the color filter of green, the switch 207 is disposed.

Then, the conductive patterns 306 are shared by a plurality of pixel 100G having the color filter of green.

A configuration like that in this modification has the effect of reducing the density of lines in a pixel having a color filter of red and in a pixel having a color filter of blue in addition to the effect of the fourth embodiment. Thus, the aperture areas of the pixel having the color filter of red and the pixel having the color filter of blue can be increased more, thereby increasing the sensitivities of these pixels.

This modification is applicable to other embodiments.

While the disclosure has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Application. No. 2016-023059 filed Feb. 9, 2016, which is hereby incorporated by reference herein in its entirety.

What is claimed is:

1. An image capturing device comprising:
a pixel unit in which a plurality of pixels are arranged in a matrix, wherein each pixel of the plurality of pixels includes a photoelectric conversion unit, a transfer transistor that transfers an electric charge accumulated in the photoelectric conversion unit, and an amplification transistor that receives the electric charge transferred by the transfer transistor at an input node,
wherein, in the pixel unit, at least two pixel rows, each including plural pixels arranged in a row direction, are arranged in a column direction different from the row direction, and the at least two pixel rows include a first pixel row and a second pixel row,
wherein a first pixel of the first pixel row includes a first switch that changes a capacitance value at an input node of an amplification transistor included in the first pixel, and
wherein a second pixel of the second pixel row includes a second switch that changes a capacitance value at an input node of an amplification transistor included in the second pixel; and
a buffer that drives the first switch and the second switch,
wherein an output node of the buffer is electrically connected to an input node of the first switch and an input node of the second switch to be common to the input node of the first switch and the input node of the second switch.

2. The image capturing device according to claim 1, wherein the buffer is a first buffer and, in the pixel unit, a plurality of pixel rows, different from the first pixel row and the second pixel row, are arranged in the column direction, the image capturing device further comprising a second buffer that is different from the first buffer and drives a plurality of switches that change capacitance values at input nodes of amplification transistors included in pixels of the plurality of pixel rows different from the first pixel row and the second pixel row, and
wherein an output node of the second buffer is electrically connected to input nodes of at least some switches of the plurality of switches to be common to the input nodes of the at least some switches of the plurality of switches.

3. The image capturing device according to claim 1, wherein, in the pixel unit, a plurality of pixel rows, different from the first pixel row and the second pixel row, are arranged in the column direction,
wherein each of plural pixels of the plurality of pixel rows, different from the first pixel row and the second pixel row, includes a switch that changes a capacitance value at an input node of an amplification transistor, and the buffer drives all switches of pixels of all pixel rows, and
wherein the output node of the buffer is further electrically connected to input nodes of all switches of the plural pixels of the plurality of pixel rows to be common to the input nodes of all the switches of the plural pixels of the plurality of pixel rows.

4. The image capturing device according to claim 1, further comprising:
a first conductive pattern that electrically connects the output node of the buffer to the input node of the first switch and is disposed in the row direction; and a second conductive pattern that branches off from the first conductive pattern and is disposed in the column direction.

5. The image capturing device according to claim 4, further comprising a third conductive pattern that is different from the first conductive pattern and is disposed in the row direction,
   wherein the second conductive pattern electrically connects the first conductive pattern to the third conductive pattern, and
   wherein the third conductive pattern is connected to the second switch.

6. The image capturing device according to claim 4, further comprising the plurality of pixels arranged in the matrix, wherein a pixel of the plurality of pixels includes:
   a first active region in which a semiconductor region that constitutes part of the photoelectric conversion unit and accumulates an electric charge generated in the photoelectric conversion unit is disposed, and
   a second active region above which an electrode constituting the input node of the first switch is disposed.

7. The image capturing device according to claim 6, wherein the second conductive pattern branches off from the first conductive pattern in a location between a third active region in which a transistor constituting the buffer is disposed and a pixel disposed at a position closest to the buffer among pixels arranged in the pixel unit.

8. The image capturing device according to claim 6, wherein the second conductive pattern branches off from the first conductive pattern in a location between the first active regions of two pixels in the plurality of pixels that are included in a same pixel row and arranged adjacent to each other.

9. The image capturing device according to claim 8,
   wherein, among the two pixels, the first active region and the second active region of one pixel, and the first active region of another pixel are sequentially arranged in that order in the row direction, and
   wherein, between the second active region of the one pixel and the first active region of the other pixel, the second conductive pattern branches off from the first conductive pattern.

10. The image capturing device according to claim 8, further comprising a capacitor disposed so that an electrically connected state to the input node of the amplification transistor can be changed in accordance with a signal supplied to the electrode,
    wherein a semiconductor region constituting part of the input node of the amplification transistor is disposed in the second active region, and
    wherein a portion that is part of the second active region and is located below the electrode constitutes at least part of the capacitor.

11. The image capturing device according to claim 10, wherein the capacitor has a surface-channel metal-oxide-semiconductor (MOS) capacitor or a buried-channel MOS capacitor.

12. The image capturing device according to claim 11,
    wherein the second active region is partitioned by a dielectric isolation portion, and
    wherein the semiconductor region constituting part of the input node of the amplification transistor and the dielectric isolation portion are disposed adjacent to each other with the electrode interposed between the semiconductor region and the dielectric isolation portion when viewed in plan.

13. The image capturing device according to claim 10,
    wherein the second active region is partitioned by a dielectric isolation portion, and
    wherein the semiconductor region constituting part of the input node of the amplification transistor and the dielectric isolation portion are disposed adjacent to each other with the electrode interposed between the semiconductor region and the dielectric isolation portion when viewed in plan.

14. The image capturing device according to claim 1, wherein the plurality of pixels include one microlens and a plurality of photoelectric conversion units that generate an electric charge based on light passing through the one microlens.

15. The image capturing device according to claim 1, further comprising a control unit configured to perform control so that all of a plurality of switches included in the plurality of pixels are simultaneously put into an ON state or an OFF state.

* * * * *